(12) United States Patent
Sesko et al.

(10) Patent No.: US 6,205,159 B1
(45) Date of Patent: Mar. 20, 2001

(54) DISCRETE WAVELENGTH LIQUID CRYSTAL TUNED EXTERNAL CAVITY DIODE LASER

(75) Inventors: David W. Sesko, Johnstown; Michael G. Lang, Longmont, both of CO (US)

(73) Assignee: Newport Corporation, Irvine, CA (US)

( * ) Notice: Subject to any disclaimer, the term of this patent is extended or adjusted under 35 U.S.C. 154(b) by 0 days.

(21) Appl. No.: 09/102,586

(22) Filed: Jun. 23, 1998

Related U.S. Application Data (60) Provisional application No. 60/050,991, filed on Jun. 23, 1997.

(51) Int. Cl.[7] .................................................. H01S 3/10
(52) U.S. Cl. .................................................. 372/20; 372/98
(58) Field of Search .................................... 372/6, 12, 44, 372/26, 75, 69, 23, 92, 20

(56) References Cited

U.S. PATENT DOCUMENTS

| | | | |
|---|---|---|---|
| 4,550,410 | 10/1985 | Chenausky et al. | 372/97 |
| 4,779,959 | 10/1988 | Saunders | 350/346 |
| 4,787,691 | * 11/1988 | Lorenzo | 350/96.14 |
| 5,068,749 | 11/1991 | Patel | 359/93 |
| 5,077,747 | * 12/1991 | Hemmer | 372/20 |
| 5,132,824 | * 7/1992 | Patel | 359/78 |
| 5,150,236 | 9/1992 | Patel | 359/71 |
| 5,191,587 | * 3/1993 | Hanson | 372/21 |
| 5,218,610 | * 6/1993 | Dixon | 372/20 |
| 5,321,539 | 6/1994 | Hirabayashi et al. | 359/94 |
| 5,428,635 | * 6/1995 | Zhiglinsky | 372/92 |
| 5,463,647 | * 10/1995 | Pan | 372/12 |
| 5,499,261 | * 3/1996 | Welch | 372/50 |

OTHER PUBLICATIONS

Hecht Optics Second Edition, Eugene Hecht, reprinted 1990, reference text, pp. 303 & 368.*

* cited by examiner

Primary Examiner—Teresa M. Arroyo
Assistant Examiner—Gioacchino Inzirillo
(74) Attorney, Agent, or Firm—Irell & Manella, LLP (57) ABSTRACT

The invention comprises a liquid crystal Fabry-Perot interferometer tuned external cavity semiconductor laser. The laser oscillates single mode at a discrete set of wavelengths defined by the transmission of an intracavity static Fabry-Perot etalon. The liquid crystal Fabry-Perot interferometer has a free spectral range larger than the gain bandwidth of the laser amplifier so that it selects only one transmission wavelength. Its resolution bandwidth is much greater than the free spectral range of the external cavity. The static intracavity etalon's free spectral range is greater than the resolution bandwidth of the liquid crystal Fabry-Perot interferometer. The static etalon maintains a single mode oscillation by providing a filter narrow enough to select only one external cavity mode.

22 Claims, 5 Drawing Sheets

DISCRETE WAVELENGTH LIQUID CRYSTAL TUNED EXTERNAL CAVITY DIODE LASER

REFERENCE TO RELATED APPLICATIONS

The application claims priority from U.S. provisional application No. 60/050,991 filed Jun. 23, 1997.

FIELD OF THE INVENTION

This invention relates to external cavity semiconductor lasers containing a combination of a nematic liquid crystal Fabry-Perot interferometer and a static etalon to tune the wavelength.

BACKGROUND OF THE INVENTION

External cavities have long been used to spectrally narrow and control the wavelength of semiconductor lasers. An external cavity semiconductor laser is comprised of an anti-reflection coated Fabry-Perot semiconductor laser coupled to a wavelength selective external cavity. External cavity laser diodes are capable of single longitudinal mode output over a range of 50 to 100 nm in the communication bands at 1300 and 1550 nm. External cavity lasers have been used in fiber testing and are useful as sources for coherent optical communications. With proper design of the external cavity's wavelength selective elements, the spectral purity of the laser may be quite high. There are several methods that have been used to suppress instabilities in the output of these devices.

The most common frequency selective device to use in an external cavity is a plane diffraction grating that retroreflects light back into the laser diode. The laser is then tuned by rotating the diffraction grating and/or a mirror that is combined with the grating. This type of filter, known as a Littrow grating external cavity, has the advantage of a very narrow bandwidth and simplicity of design. The mode selectivity of a Littrow grating external cavity has been enhanced by placing a solid Fabry-Perot etalon within the cavity. (N. A Olsson et al. "Performance characteristics of 1.5 μm external cavity semiconductor lasers for coherent optical communications", Journal of Lightwave Technology, Vol. LT-5, 510–515, [1987]). The solid etalon is rotated along with the grating to reduce the amplitude of the laser's adjacent longitudinal modes to 40 dB below the power in the main resonance. An alternative geometry for a grating tuned laser is in grazing incidence and is known as the Littman-Metcalf external cavity laser. The advantage here is that the area illuminated by the grating is much larger than in Littrow and that the laser beam double passes the grating. This results in a much higher resolution so that a solid etalon is not needed to suppress the adjacent longitudinal modes. The disadvantage of grating tuned external cavities lies in the inability to tune rapidly since it is limited to frequencies below the bulk mechanical resonances of the system. One also needs to tune the laser with a mechanical actuator, the most common of these being a piezoelectric crystal. The high voltages needed to operate the capacitive piezoelectric crystals require a significant amount of power to operate at high frequencies. Because of the relatively large size and large power consumption, mechanically tuned systems are not ideal for use in hand held battery operated devices. Alternative methods of tuning include electro-optically tuned external cavity lasers.

Tuning of semiconductor lasers using intracavity birefringent filters has been demonstrated using conventional electro-optic materials such as potassium dihydrogen phosphate (KDP). However, these materials require several kilovolts to scan wavelengths over ranges of only 10 nm. The low tuning range and high voltages needed to achieve this range do not result in a compact source. More recently, nematic liquid-crystal based filters have been used to tune external cavity lasers. Liquid crystal based filters require only 10's of volts to tune over a large range. They are capacitive devices so their power consumption is only in the pW range. Since the power consumption is so low, they may be powered using conventional batteries.

An electro-optically tuned laser was developed using a two stage birefringent filter (J. R. Andrews, "Low Voltage Wavelength Tuning of an External Cavity Diode Laser Using a Nematic Liquid Crystal-Containing Birefringent Filter", IEEE Photonic Technology Letters, Vol.2, 334–336, [1990]). Each stage of the filter is composed of a KDP crystal, a liquid crystal, and a polarizer. The two stages are necessary to increase the scan range of the device, but it still exhibits a short scan range of only 2.6 nm. The device also required the use of two KDP crystals, two liquid crystals, and two polarizers. The large number of intracavity elements increases the loss of the cavity due to scattering of light. It also adds cost to the device and makes it complex to construct.

A simpler wavelength selective filter is a liquid crystal Fabry-Perot Interferometer (LC-FPI). The concept of the LC-FPI was first reported by Gunnin et al. in 1981 for the 3–5 μm wavelength range, but performance was poor. Mallison proposed that the LC-FPI could be used as an optical filter for wavelength division multiplexing(WDM), but the bandwidth was too broad for the assigned channel separations. More recent work conducted by Patel et al. (U.S. Pat. No. 5,150,236) and Hirabayashi et al. has improved the performance of these devices so that they are useful in wavelength division multiplexing communication systems.

Figure 1:
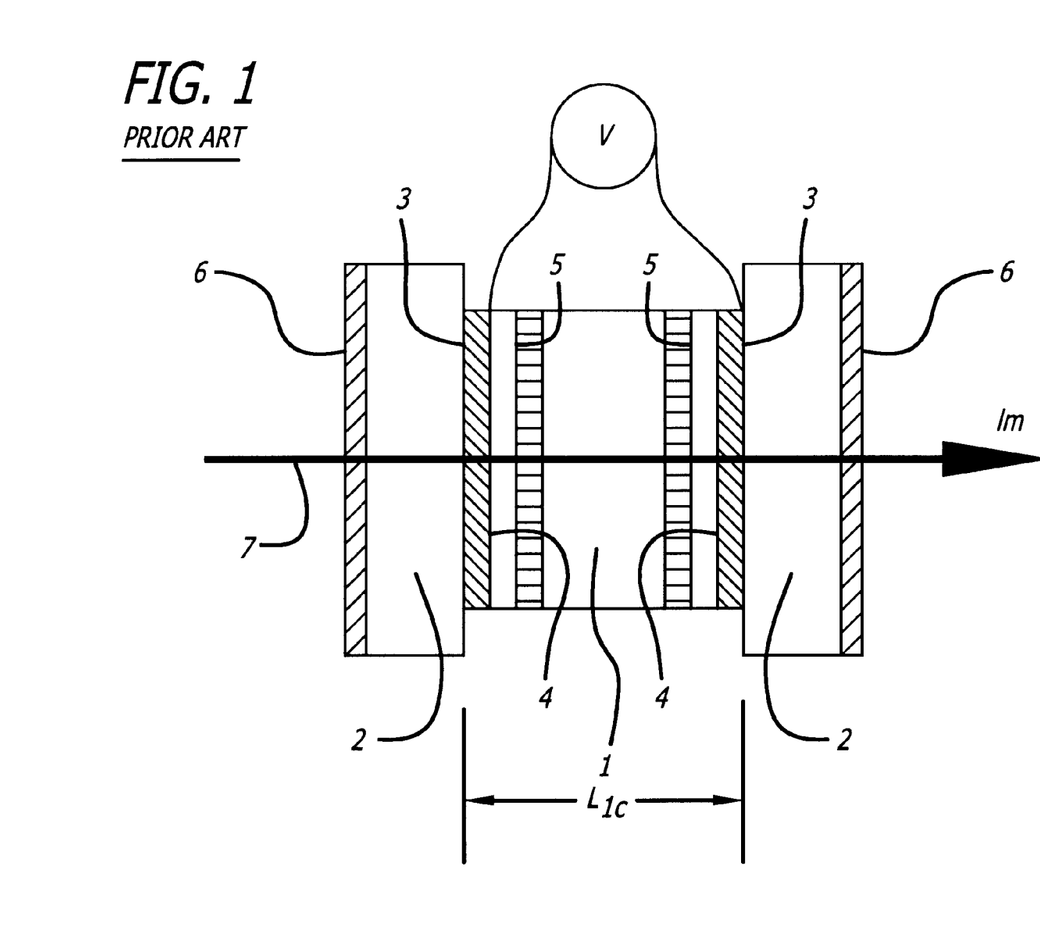
FIG. 1 is a prior art schematic of a liquid crystal Fabry-Perot interferometer.

Reference is made to FIG. 1, depicting the prior art, which shows a schematic of a liquid crystal Fabry Perot interferometer (LC-FPI). A thin liquid crystal layer 1 of refractive index $n_{lc}$ is inserted between two glass substrates 2. Each of the glass substrates has a conductive layer formed by indium tin oxide (ITO) 3 and a high reflectivity dielectric mirror layer 4 deposited over the ITO layer located adjacent to the liquid crystal. An alignment layer 5 deposited on the dielectric mirror orients the liquid crystal molecules. The ITO layer absorbs at 1550 nm, so it must be placed external to the cavity mirrors. The substrates are aligned so that the reflective surfaces are parallel and separated by distance $L_{lc}$. The substrates are usually slighly prismatic to avoid multiple reflections between their surfaces, and the outside surfaces of the substrates have antireflection coatings. The wavelengths $\lambda_m$ of light beam that are transmitted by the LC-FPI form a comb of peaks given by the relationship:

$$\lambda_m = 2n_{lc} L_{lc} \cos(\theta)/m$$

where m is an integer and θ is the angle if incidence relative to the normal of the reflective surface. Liquid crystals have a large refractive index anisotropy. When no voltage V is applied the liquid crystal molecules orient themselves with the their ordinary axis parallel to the glass substrates. When a voltage V is applied to the liquid crystal, the molecules rotate so that the refractive index gradually changes from the ordinary refractive index to the extraordinary refractive index. The change in the refractive index changes the optical path length between the two mirrors, thereby tuning transmission spectra of the LC-FPI according to the above relationship. Liquid crystal based filters require only 10's of volts to tune over a large range. Since the power consumption is so low, they may be powered using conventional batteries.

The first demonstration of an intracavity LC-FPI to tune a laser was in a fiber ring laser (M. W. Maeda et al., An Electronically Tunable Fiber Laser with a Liquid Crystal Etalon Filter as the Wavelength Selective Element; IEEE Photonics Technology Letters, Vol. 2, 787–789 [1990]). This laser exhibited a wide tuning range and low power consumption, but it was susceptible to multimode behavior because of the long optical path length of the external cavity, $L_{op}$. The long cavity length results in the free spectral range of the external cavity being smaller than the resolution bandwidth of the LC-FPI. A more compact cavity design using a retroreflecting end mirror and an intracavity LC-FPI. (Tsuda et al., "Tunable Light Source Using a Liquid-Crystal Fabry-Perot Interferometer", IEEE Photonics Technology Letters, Vol. 3, 504–506, [1991]). In this design, the transmission of an intracavity LC-FPI selects a wavelength that may be retroreflected by the cavity's end mirror. The gain medium of the laser was a multi-quantum well (MQW) laser diode. The laser device still exhibited multimode behavior because the external cavity free spectral range is still much less than the resolution bandwidth of the LC-FPI. To compensate for the multimode behavior, a separate phase control (PC) section on the laser was needed for shifting the internal modes of the laser diode. Single mode operation is obtained by tuning the transmission peak of the LC-FPI and then adjusting the internal gain ripple of the laser diode by applying voltage to the PC section. The problem with such an approach is that it necessitates a method to constantly monitor the mode structure of the output beam and compensate the PC section accordingly. This limits the device's compactness and usability in the field.

Representative of the art is U.S. Pat. No. 5,150,236 to Patel (1992) which describes a tunable liquid-crystal etalon filter comprising two dielectric stack mirrors defining an optical cavity into which is filled a liquid crystal. Application of an electric field to the crystal changes its refractive index and, hence, its optical length.

Also representative of the art is:

U.S. Pat. No. 5,321,539 to Hirabayashi et al (1994) discloses a tunable wavelength filter having a liquid crystal layer.

U.S. Pat. No. 5,068,749 to Patel (1991) discloses an electronically tunable polarization-insensitive optical filter.

U.S. Pat. No. 4,779,959 to Saunders (1988) discloses an electro-optic modulator comprising a Fabry-Perot etalon.

U.S. Pat. No. 4,550,410 to Chenausky et al (1985) discloses a laser using a Fabry-Perot etalon coupled to an optical cavity.

SUMMARY OF THE INVENTION

The main aspect of the present invention is to provide an external cavity semiconductor laser that tunes to a discrete set of wavelengths by changing the voltage to a liquid crystal Fabry-Perot interferometer (LC-FPI).

Another aspect of the present invention is to provide a discrete wavelength liquid crystal tuned external cavity diode laser with the Fabry-Perot interferometer having a free spectral range larger than the gain bandwidth of the laser amplifier so that it selects only one transmission wavelength.

Another aspect of the present invention is to provide a discrete wavelength liquid crystal tuned external cavity diode laser having a static intracavity etalon having a free spectral range that is greater than the resolution bandwidth of the liquid crystal Fabry-Perot interferometer.

Another aspect of the present invention is to provide a discrete wavelength liquid crystal tuned external cavity diode laser wherein the static etalon maintains a single mode oscillation by providing a filter narrow enough to select only one external cavity mode.

Another aspect of the present invention is to provide a discrete wavelength liquid crystal tuned external cavity diode laser wherein the static etalon in the external cavity defines a set of wavelengths, and the LC-FPI selects the resonant wavelengths.

Another aspect of the present invention is to provide a discrete wavelength liquid crystal tuned external cavity diode laser which operates on a single longitudinal mode without the necessity of external monitoring equipment.

Another aspect of the present invention is to provide a discrete wavelength liquid crystal tuned external cavity diode laser which is capable of tuning over 100 nm range at rates of 10's of msec.

Another aspect of the present invention is to provide a discrete wavelength liquid crystal tuned external cavity diode laser which is compact, relatively inexpensive, and have a low power consumption so that it may be run on batteries.

The present invention comprises an external cavity semiconductor laser that tunes to a discrete set of wavelengths by changing the voltage to a liquid crystal Fabry-Perot interferometer. The discrete set of wavelengths one may tune to is defined by a static intracavity etalon. The liquid crystal Fabry-Perot interferometer has a free spectral range larger than the gain bandwidth of the laser amplifier so that it selects only one transmission wavelength. Its resolution bandwidth, however, is much greater than the free spectral range of the external cavity. The static intracavity etalon's free spectral range is designed so that it is greater than the resolution bandwidth of the liquid crystal Fabry-Perot interferometer. The static etalon maintains a single mode oscillation by providing a filter narrow enough to select only one external cavity mode.

Many applications, such as wavelength division multiplexing (WDM) require a discrete comb of wavelengths that are precisely defined. The static etalon in the external cavity defines this set of wavelengths, and the LC-FPI selects at which wavelengths the laser resonates. The static etalon may in turn be referenced to an atomic or molecular wavelength standard so that a comb of wavelengths may be reproducible from laser to laser.

The advantage of this design is that it insures that the laser operates on a single longitudinal mode without the necessity of external monitoring equipment. It will resonate at only those wavelengths that are transmitted by the static etalon and so will useful as a wavelength reference source in WDM applications. It also is capable of tuning over 100 nm range at rates of 10's of msec. It can also be made compact, relatively inexpensive, and have a low power consumption so that it may be run on batteries.

The external cavity laser disclosed herein operates at 1550 nm. The design is chosen to match the WDM wavelengths. However, the combination of a solid fused silica (static) etalon and a liquid crystal etalon for discrete tuning also can be used at any wavelengths of presently available single spatial mode diode lasers. The laser gain profile versus wavelength for a 1550 nm laser is typically 100 nm wide. The intracavity tuning elements consist of a solid etalon, a liquid crystal etalon, a 80 nm FWHM fixed notch filter centered at 1540 nm, and a liquid crystal phase compensator or a piezo electric transducer on the end mirror. The solid etalon has a free spectral range of 100 GHz to match the WDM wavelengths. This solid etalon provides a discrete comb of wavelengths to which the laser can be tuned. The solid etalon's transmission wavelengths can be adjusted using incident angle and temperature to match the WDM communication wavelengths. The solid etalon mode at which the laser will oscillate is in turn chosen by a liquid crystal or ferroelectric-filled etalon with a free spectral range of 100 nm. A 80 nm bandwidth interference filter is needed only if the gain bandwidth of the laser exceeds the free spectral range of the liquid crystal etalon. The interference filter prevents stability problems between the successive transmission orders of the liquid crystal etalon. A flat mirror or corner cube reflector serves as the retroreflector for this cavity. This end mirror may be tuned with a piezo-electric transducer to match the phase of the external cavity with that of the solid etalon. Alternatively, the external cavity phase may be adjusted electro-optically with a liquid crystal. An external cavity phase is servo controlled by monitoring the output power of the laser with a photodiode. When the longitudinal mode of the external cavity matches that of the solid etalon, the power will be at a maximum. To achieve single mode operation in an external cavity semiconductor laser, the FWHM bandwidth of the solid etalon filter needs to satisfy two conditions. First, the FWHM of the solid etalon must be less than the external cavity longitudinal mode spacing. This is known as the external cavity mode selectivity. An external cavity optical path length of 30 mm gives a free spectral range of 5 GHz. A finesse of 30 for the solid etalon with a 100 GHz free spectral range gives a FWHM linewidth of 3.3 GHz. This meets the first criterion for stable operation. Second, the solid etalon's finesse divided by the free spectral range of the solitary laser diode must be less than 0.3 for a cavity loss ratio of 20 dB=101 og $(R_{ext}/R_{f2})$, where $R_{est}$ is the effective external cavity reflectivity and $R_{f2}$ is the front facet reflectivity of the laser diode. The free spectral range of a 400 µm long AlGaAs/InP laser diode is 107 GHz. For a perfect etalon, this implies a reflectivity of at least 0.90. However, surface figure imperfections and wedge and coating losses all contribute to reduce the finesse of the solid etalon. VIRGO™ Optics estimates that the defect-limited finesse of λ/40 transmitted wavefront error (over a 5 mm aperture) at 632 nm, leads to a maximum finesse of λ/100 nm, or a finesse of 15 @ 1550 nm wavelength. However, a substantial increase in the finesse may be realized by reducing the diameter of the beam. This is because the effect of the imperfect surface and insufficient parallelism reduces as the diameter of the beam decreases. It has been experimentally observed that the finesse increases monotonically as the diameter of the beam decreases. Thus, reducing the diameter to a 1 mm spot size should potentially increase the defect limited finesse to approximately 150. This implies that the quality of the reflective coatings will limit the true finesse of the etalon.

In order to achieve a relative repeatability of 0.01 nm wavelength from unit to unit, the thickness of the solid etalon needs to be toleranced to −0.00%/+0.02%. The solid etalon may then be angle tuned up to its acceptance angle (~10 degrees) so that the transmission peaks match a predetermined set of discrete wavelengths. The solid etalon is temperature controlled to maintain its stability. This temperature control may be referenced to an external wavelength standard which is periodically sampled to maintain the wavelength repeatability of the solid etalon. The liquid crystal etalon serves as the course tuning element, discriminating between the peaks defined by the solid etalon. A 2 micron thick liquid crystal etalon will have a free spectral range of 100 nm at a wavelength of 1550 nm. In order to discriminate between the adjacent peaks of the solid etalon, the liquid crystal etalon needs to have FWHM bandwidth that is less than the free spectral range (c/2nL) of the solid etalon. This implies a finesse of 30 which should be attainable by reducing the spot size of the incident beam. The finesse that may be achieved for a 500 micron beam diameter is typically ~100 and the tuning speed of the etalon is typically 1 kHz over its entire range of 52 nm (10V p-p input). Ferroelectric crystals can achieve higher tuning speeds but have a reduced finesse due to domain defects.

The minimum effective reflectivity of the external cavity must be greater than the reflectivity of the laser diode's front facet multiplied by the square of the linewidth enhancement factor, α. Assuming $R_{f2}$=0.001 and α=10, the effective reflectivity that is required from the external cavity to support stable single mode oscillation is approximately 10% neglecting lens coupling losses. Approximately 20% feedback (neglecting recoupling efficiency back into the diode's waveguide) is required from the external cavity in order to insure single mode operation. Assuming a 95% reflectivity from the end mirror and a 70% single pass transmission through the liquid crystal etalon, a 90% single pass transmission through the solid etalon, and a 90% transmission through the 50 nm bandwidth interference filter, the external cavity feedback is approximately 30% which insures single mode operation.

The entire cavity is temperature controlled in order to have repeatable system. It is estimated that a 250 micron fused silica etalon will tune approximately −0.01 nm/degree Kelvin. The present invention has a temperature control servo which maintains a temperature stability of 0.1 K over the bulk cavity and 10 mK for the diode laser. The dependence of the liquid crystal etalon on temperature is about 0.03 nm for this level of temperature control. Thus, the liquid crystal will be able to repeatably select the same peak of the solid etalon.

Other aspects of this invention will appear from the following description and appended claims, reference being made to the accompanying drawings forming a part of this specification wherein like reference characters designate corresponding parts in the several views.

Before explaining the disclosed embodiment of the present invention in detail, it is to be understood that the invention is not limited in its application to the details of the particular arrangement shown, since the invention is capable of other embodiments. Also, the terminology used herein is for the purpose of description and not of limitation.

DETAILED DESCRIPTION OF THE PREFERRED EMBODIMENT

The invention disclosed is a liquid crystal tuned external cavity laser. It is designed to oscillate single mode at a discrete set of wavelengths defined by the transmission of a Fabry-Perot interferometer (LC-FPI). Applications such as wavelength division multiplexing, WDM, require a comb of wavelengths that are precisely defined. The static etalon in the external cavity defines this set of wavelengths and a liquid crystal Fabry-Perot interferometer in the external cavity selects the static etalon's transmission order. This static etalon may be a solid etalon or an air spaced etalon. The term "static etalon" refers to the fact that the mirror spacing and index of the medium within these mirrors stays constant. Although the terms Fabry-Perot interferometer and etalon are equivalent we use the former term to describe the liquid crystal device and the latter for the static device to simplify the discussion.

The laser diode that is used is a 1570 nm center wavelength multi-quantum well ridge waveguide laser, although other wavelength semiconductor lasers may also be used with this device. These lasers are commercially available. When a current is applied to the laser chip, light is generated by a recombination of electron-hole pairs in the active region. At low current levels, a laser chip undergoes spontaneous emission. As the current level increases, diodes undergo a threshold transition where stimulated emission occurs, and the light is amplified. At this point the light emission becomes very efficient. The laser threshold will depend on the gain of the laser diode and how well the light is confined to the active region. Gain is the amount of stimulated emission a photon can generate per unit distance traveled along the active region. Gain will increase with increasing laser current. The confinement to the active region is provided by the active region's waveguide design and the reflective mirror surfaces at the rear and front facets of the laser diode. Since diodes have active regions with an index of refraction of 3.5, the reflectivity of the diode's facets will initially be around 35% without any coatings on them. The laser chip forms its own Fabry-Perot cavity and which has a constructive interference at integral half-wavelengths of the optical length inside the laser cavity $L_d$. Typically, the length of the diode will be around 250 mm, and so the Fabry-Perot modes will be spaced by about 1.2 nm. As the current to the diode is increased, the Fabry-Perot mode or modes that will oscillate will be where the greatest laser gain versus loss is found. The wavelength can be tuned for the solitary laser diode by shifting the gain curve of the laser diode by changing its temperature or injection current. In this case the laser can only be tuned to a wavelength or wavelengths limited by the gain-loss curve of the laser diode. In order to obtain more control over the laser wavelength, a mechanism to introduce loss at all but one wavelength into the laser cavity is disclosed.

To enhance the control of the selected wavelength with external cavity losses one must reduce Fabry-Perot etalon effects of the solitary laser diode which may interfere destructively with a wavelength selected by the external cavity. This is done by an anti-reflection coating on the laser's front facet. To achieve a stable single mode, the ratio of the effective external cavity reflectivity, $R_{eff}$, versus the reflectivity of the front facet, $R_{fr}$, is given in terms of the linewidth enhancement factor, $\alpha$, by the relationship.

$$R_{eff}/R_{fr}=\alpha^2$$

The effective external cavity reflectivity estimated at $R_{eff}$=20% includes all round trip losses from the wavelength selective elements and the lens. The linewidth enhancement factor has been measured for a number of lasers and increases at the edges of the laser's gain region. The maximum value of the linewidth enhancement factor is typically around 14 at the edges of the tuning range which infers that a reflectivity of less than 0.1% is needed. The front facet of the laser diode may be covered by a single or multiple layer dielectric anti-reflection coating to achieve these reflectivities. A single antireflection coating using a quarter wave of $SiO_x$ has been used to anti-reflection coat the laser to a reflectivity of 0.05%. However, the single layer designs are not broad enough to cover the entire gain bandwidth of the diode laser and also require unreasonable control of the layers index of refraction and thickness. By using a multi-layer design these tight tolerances may be loosened. A four layer stack consisting of alternating layers of low and high index materials produces a broadband anti-reflection coating. This stack is produced by quarter waves of $SiO_2/Si_3N_4/SiO_2/Si_3N_4$. The anti-reflection coating permits the tuning over a broadband of the spontaneous emission by the external cavity and reduces the modulation of the output power of the diode due to the Fabry-Perot interferences of the two facets. The low reflectivity on the front facet of the laser diode prevents parasitic oscillation of the solitary diode modes, however, even at a reflectivity of 0.05% a modulation of the power is observed at the period of the free spectral range of the laser diode when tuned with the external cavity.

The external cavity is formed by an end mirror which acts as both a retroreflector and an output coupler. The optical path from the end mirror to the back facet of the laser diode forms a Fabry-Perot cavity that has a free spectral range that depends inversely on the optical path length of the external cavity, $L_{op}$. Typically, the shortness of the optical path length is limited by the thickness of the wavelength selective elements within the external cavity. In the present invention, an optical path length of 3 cm leads to a free spectral range of 5 GHz. Thus, the laser diode will oscillate at any one of the modes that is defined by the resonance of the external cavity. Since the modes are so closely spaced compared to the gain bandwith of the diode, the laser may oscillate on many modes simultaneously.

Figure 3:
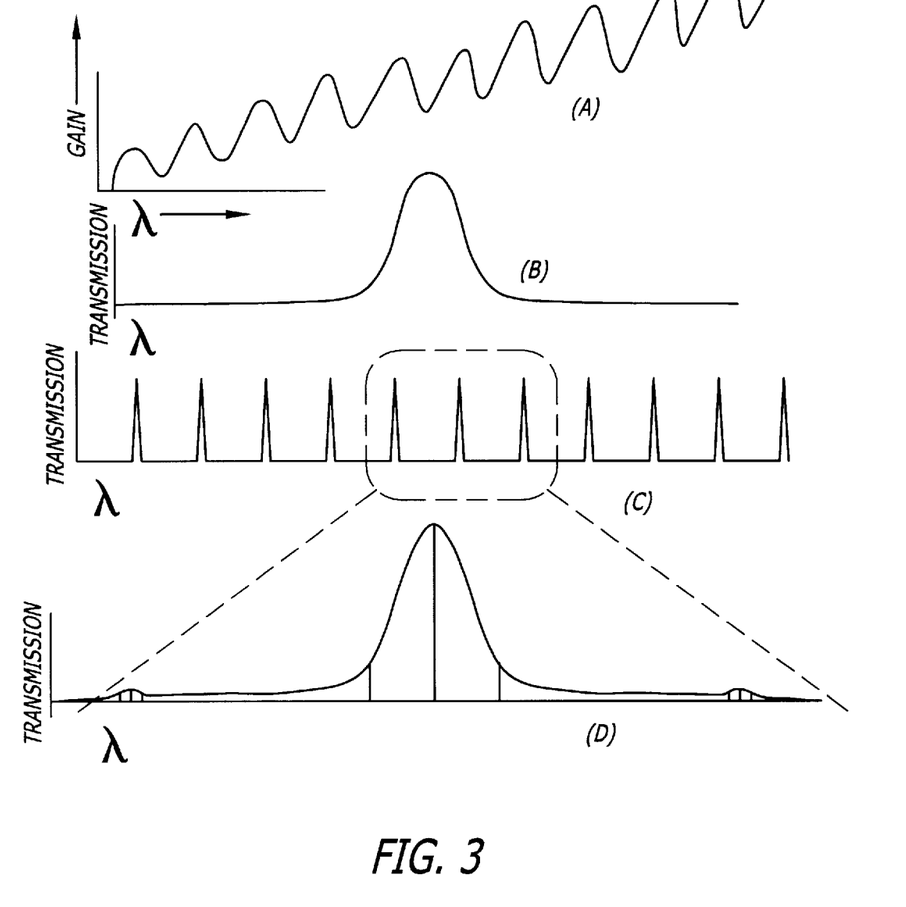
FIG. 3 is a diagram illustrating the gain bandwidth of the semiconductor amplifier (A), the transmission modes of the LC-FPI(B), the transmission modes of the static intracavity etalon(C), and the external cavity longitudinal modes(D).

FIG. 3 clarifies the relationship between various axial modes that may exist and the filtering properties of the interferometers placed within the external cavity. Gain curve A of FIG. 3 shows part of the gain bandwidth of the antireflection coated laser diode. The modulation of this gain curve A is due to the presence of residual reflectivity on the front facet. Below this gain curve, the transmission of the liquid crystal Fabry-Perot interferometer is illustrated in curve B. In curve B, a finesse of 200 and a free spectral range of 100 nm is assumed which are close to the actual values. The double pass transmission of the static etalon is illustrated below this by the comb peaks as shown in curve C. These peaks are separated by 100 GHz which corresponds to the channel spacings for the WDM communications wavelengths and has a finesse of 100. The combined transmission of the liquid crystal Fabry-Perot interferometer and the static etalon is shown in curve D on an expanded scale. The transmitted external cavity modes are also shown.

The design choice for the wavelength filters that control the frequency of the laser are determined by the required tuning range, the tuning resolution, the required contrast ratio of the main to satellite peaks of the etalon-interferometer pair, and the finesse of the static etalon and the liquid crystal Fabry-Perot interferometer. There may be many variations in this design depending on what finesse and transmission is possible with liquid crystal Fabry-Perot interferometers. The technique of placing multiple interferometers in series as a spectroscopic filter is well documented. The transmission of a pair of interferometers is equal to the product of their individual transmissions.

The general equations governing the transmission of the interferometers will be set forth here. They apply both to the liquid crystal Fabry-Perot interferometer and the static Fabry-Perot etalon. The free spectral range in terms of the separation of the mirror surfaces L, the index of refraction n of the medium sandwiched between the mirrors and the speed of light c is given by:

$$\Delta v = c/2nL.$$

The single pass transmission of a Fabry-Perot filter is given by:

$$I_t = I_{max}(1+(4/\pi^2)F^2 \sin^2(2\pi nL/\lambda))^{-1}$$

where $\lambda$ is the wavelength, F is the finesse, and $I_{max}$ is the maximum transmission at the resonance wavelength. The finesse of a Fabry-Perot interferometer is determined by the combination of the reflection finesse $F_R$ and a surface defect finesse $F_S$. The reflectivity finesse is determined by the mirror reflectivity R and the cavity round trip loss of the liquid crystal $g_{rt}$ due to absorption $\alpha_{LC}$:

$$F_R = \pi(g_{rt})^{1/2}/(1-g_{rt})$$

$$g_{rt} = R \exp(-2\alpha_{LC}L_{LC})$$

The surface defect finesse is determined by the wavefront and surface roughness of the glass substrates and the parallelism of those substrates. The finesse is defined as the free spectral range divided by the bandwidth of transmission. Thus, one would have for surface defects that changed the cavity length by $\Delta L$ over the laser beam spot size the relation:

$$F_S = \lambda/2n\Delta L$$

The total finesse is then given by:

$$F^{-2} = F_R^{-2} + F_S^{-2}$$

The maximum transmission $I_{max}$ is affected both by the losses in the cavity and the surface defects of the mirrors. The transmittance must take into account the mirror reflectivity and absorption in the liquid crystal. The finesse of the etalon is inversely proportional to the spot size diameter and the transmission is proportional to the square root of the spot size diameter. This improvement in performance is observed as long as the focused beam's cone angle does not start to lower the finesse. This allows us to increase the performance of the liquid crystal interferometer by reducing the diameter of the spot size. Thus it is important to have the liquid crystal near the beam focus at the output mirror.

Since the interferometers are double passed in the external cavity the net transmission is squared to give the transfer function of the interferometer pair. The full width half max FWHM of the interferometer is given by the free spectral range divided by its finesse F:

$$FWHM = FSR/F.$$

Both the interferometers in this cavity must be tilted off-axis slightly to avoid coupling direct reflections off the mirror surfaces.

The tuning range of the liquid crystal Fabry-Perot interferometer will be less than the free spectral range of the interferometer.

The static etalon in the preferred embodiment is either a solid fused silica etalon or an air spaced etalon. Its transmission wavelengths may be changed by rotating the angle incidence and/or temperature tuning the etalon. The relationship for the m-th order transmission wavelength is given in terms of the length of the static etalon $L_{SE}$, the index of refraction $n_{SE}$, and the angle of incidence to the etalon's normal $\theta$:

$$\lambda_m = 2n_{SE}L_{SE} \cos(\theta)/m$$

The WDM wavelengths are integrally divisible by their separation of 100 GHz. This makes the WDM wavelengths correspond to the transmission wavelengths of the static etalon when the angle of the etalon is adjusted so its free spectral range is 100 GHz. For instance, if a solid etalon of fused silica is used with $L_{SE}$=1.05 mm, the required angle to achieve the WDM wavelengths would be $\theta$=10.65 degrees. Temperature may also be used to tune the wavelength of transmission by the change of the index of refraction and the linear expansion. The temperature tuning dependence of a fused silica etalon is calculated to be −2.35 GHz/K. In an alternative embodiment not shown a liquid crystal may be combined with a solid substrate to form a heterostructure etalon that would have the narrow bandwidth required for filtering out the external cavity modes. (U.S. Pat. No. 321,539) The liquid crystal would then be used to set the wavelength of transmission of this etalon anywhere within the 100 GHz free spectral range of the device.

The external cavity is defined by the optical path length from the laser diode's rear facet through the intracavity elements to the other end mirror of the cavity. To couple the phase of the external cavity mode to static etalon transmission, the optical path length of the external cavity needs to be adjusted so that it equals a multiple half-wavelength of the transmission wavelengths selected by the static etalon. The function may be accomplished by using a liquid crystal phase modulator to adjust the optical path length or mechanically changing the cavity length with a piezo-electric transducer. The phase adjustment range only needs to cover one free spectral range of the external cavity. The piezo-electric transducer is operated by simple servo electronics 10 that maximize the power output of the laser as detected by a photodiode. In the cases where only one output beam is available, as shown in FIGS. 2E and 2F, an external cavity beamsplitter 8 is used to reflect a small part of the beam to the photodiode 9. In the case where we have a TO style header for the laser diode and use a corner cube beam retroreflector as shown in FIG. 2F, an intracavity beamsplitter 14 is used both to couple the output beam and the beam to the photodiode 9.

The choice of etalons in the external cavity and their free spectral ranges (FSR) are determined by the required tuning range, the tuning resolution, the required contrast ratio of the main to satellite peaks, and the finesse of the etalons. There may be many variations in this design depending on what finesse and transmission is available with the liquid crystal Fabry-Perot interferometers. The technique of using multiple interferometers as a spectroscopic filter is well documented, so it is not necessary to describe this work in detail. However, the technique of placing multiple etalons in an external cavity laser diode for the purpose of tuning has not been previously demonstrated.

The transmission of a set of interferometers is given by the product of their individual transmissions. The tuning range of an interferometer is given by the free spectral range:

$$FSR=c/2nL$$

The resolution of the interferometer is given by:

$$\delta v=FSR/N$$

where c is the speed of light, n is the group refractive index of the etalon medium, L is the spacing of the interferometer plates, and N is the finesse of the interferometer. Thus, the tuning range of a set of interferometers will be determined by the interferometer with the smallest L, while the resolution and wavelength stability will be determined by the etalon with the largest L. The basic relationship $$m\lambda=2nL \cos \theta$$

gives the transmission wavelength θ of the interferometer where m is the integer order of the interferometer, and λ is the incident angle. Note that the interferometers must be slightly tilted with respect to each other, and with the laser optic axis so as to avoid interference between the external surfaces of the adjacent interferometers and to avoid direct feedback into the laser from reflections off the mirror surfaces. The liquid crystal etalons have an antireflection coating on the outside of the glass plates to reduce any etalon effects between the surfaces of the plates.

Figure 2A:
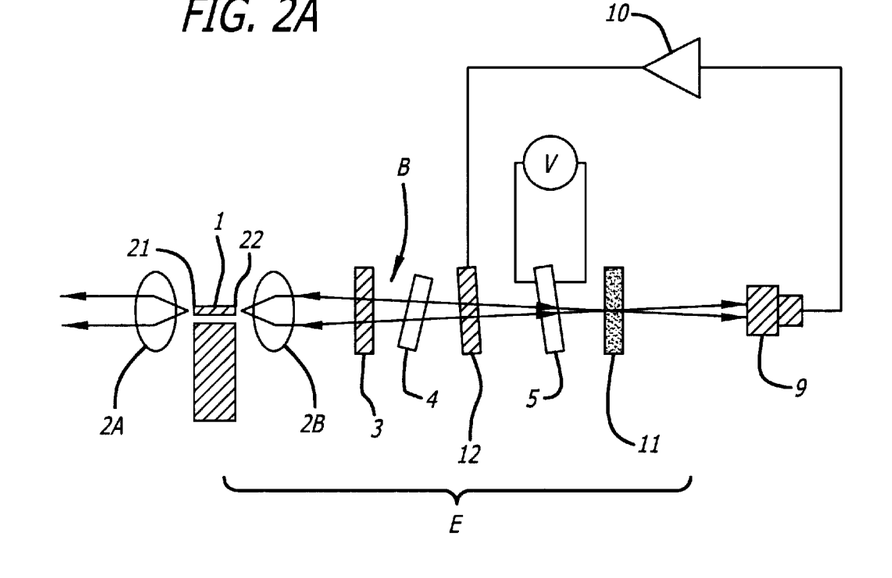
FIG. 2A is a schematic side view of the preferred embodiment of the present invention with a liquid crystal phase compensator.
Figure 2B:
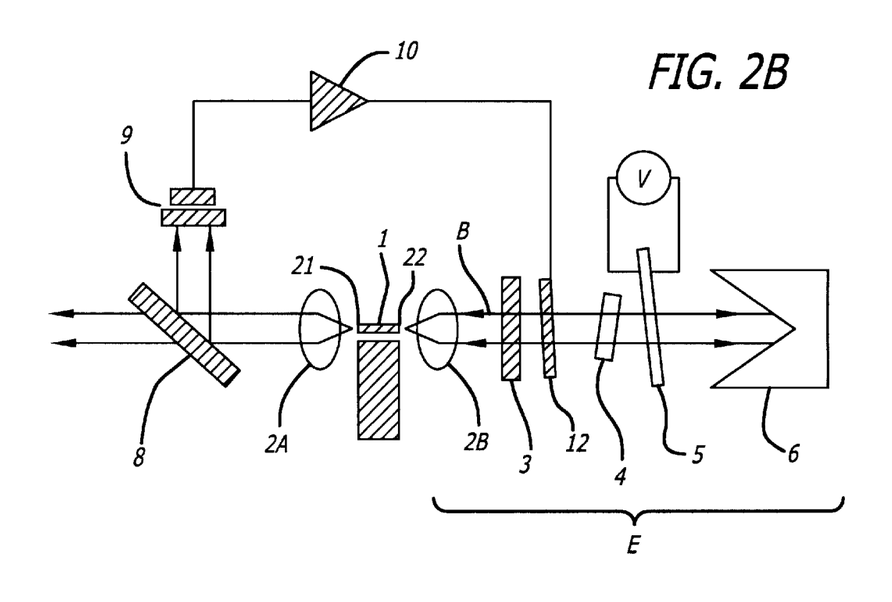
FIG. 2B is a schematic side view of an alternate embodiment the present invention with a corner cube retroreflector.
Figure 2C:
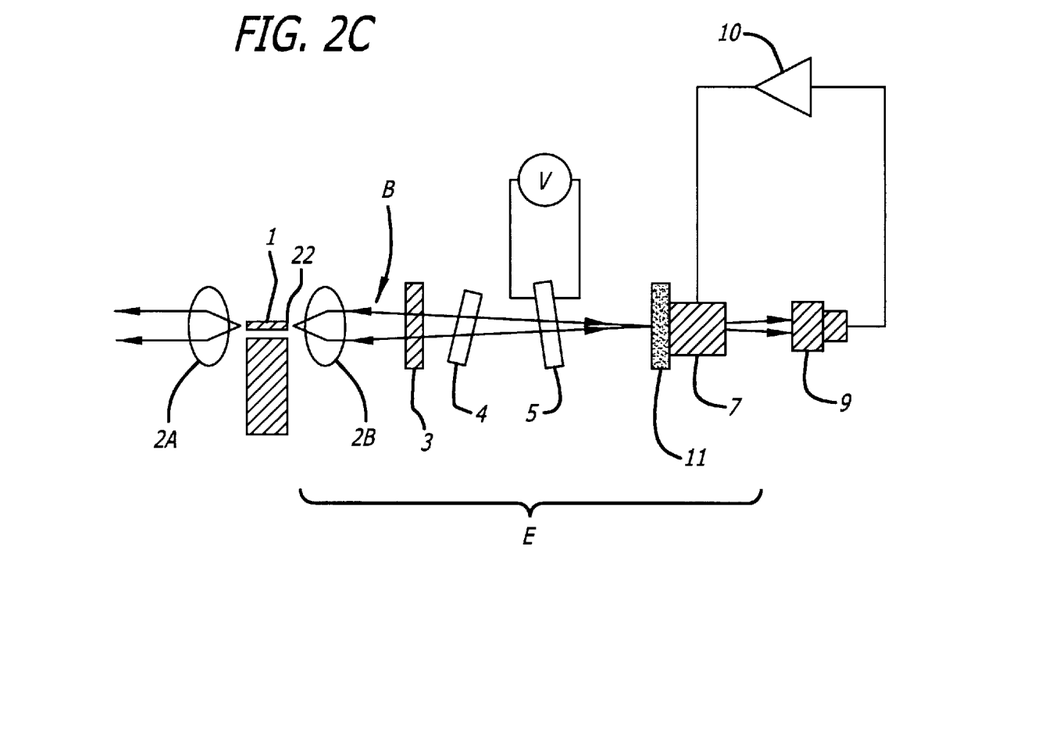
FIG. 2C is a schematic side view of an alternate embodiment of the present invention with a mirror and a piezo-electric transducer.

Reference is made to FIG. 2A for the following description. The external cavity laser described is operated at 1550 nm and the design is chosen to match the WDM wavelengths. However, the combination of a solid fused silica etalon 4 and a liquid crystal etalon 5 for discrete tuning also can be used at any wavelengths of presently available single spatial mode diode lasers from 600 nm to 2400 nm wavelength. The laser gain profile versus wavelength for a 1550 nm laser is typically 100 nm wide. The intracavity tuning elements consist of a solid etalon 4, a liquid crystal etalon 5, a 80 nm FWHM fixed notch optical filter centered at 1540 nm 3, and an end flat mirror 11. The solid etalon 4 has a free spectral range of 100 GHz to match the WDM wavelengths. This etalon 4 provides a discrete comb of wavelengths to which the laser can be tuned. The etalon's transmission wavelengths can be adjusted using incident angle and temperature to match the WDM communication wavelengths. The etalon mode at which the laser will oscillate is in turn chosen by a liquid crystal or ferroelectric-filled etalon 5 with a free spectral range of 100 nm. An 80 nm interference filter 3 is needed only if the gain bandwidth of the laser 1 exceeds the free spectral range of the liquid crystal etalon 5. The interference filter 3 prevents stability problems between the successive transmission orders of the liquid crystal etalon 5. A flat mirror 11 serves as the retroreflector for the external cavity. This end mirror may be tuned with a piezo-electric transducer 7 as shown in FIGS. 2C and 2E to match the phase of the external cavity E with that of the solid etalon 4. Alternatively, the external cavity phase may be adjusted electro-optically with a liquid crystal modulator 12 as shown in FIGS. 2A and 2B. The external cavity phase is servo controlled 10 by monitoring the output power of the laser with a photodiode 9. When the longitudinal mode of the external cavity matches that of the solid etalon 4, the power will be at a maximum.

To achieve single mode operation in an external cavity semiconductor laser, the FWHM bandwidth of the solid etalon 4 filter needs to satisfy two conditions. First, the FWHM of the solid etalon 4 must be less than the external cavity longitudinal mode spacing. This is known as the external cavity mode selectivity. An external cavity optical path length of 25 mm gives a free spectral range of 5 GHz. A finesse of 30 for the solid etalon with a 100 GHz free spectral range gives a FWHM linewidth of 3.3 GHz. This meets the first requirement for stable operation. Second, the solid etalon's 4 finesse divided by the free spectral range of the solitary diode laser 1 must be less than 0.3 for a cavity loss ratio of 20 dB=101 og ($R_{ext}/R_{f2}$), where $R_{est}$ is the effective external cavity reflectivity and $R_{f2}$ is the front facet reflectivity of the laser diode. The free spectral range of a 400 μm long AlGaAs/InP laser diode is 107 GHz. For a perfect etalon, this implies a reflectivity of at least 0.90. However, surface figure imperfections and wedge and coating losses all contribute to reduce the finesse of the solid etalon. VIRGO™ Optics estimates that the defect-limited finesse of λ/40 transmitted wavefront error (over a 5 mm aperture) at 632 nm, leads to a maximum finesse of λ/100 nm, or a finesse of 15 @ 1550 nm wavelength. However, a substantial increase in the finesse may be realized by reducing the diameter of the beam. This is because the effect of the imperfect surface, and insufficient parallelism reduces as the diameter of the beam decreases. It has been experimentally observed that the finesse increases monotonically as the diameter of the beam decreases. Thus reducing the diameter to a 1 mm spot size should potentially increase the defect limited finesse to approximately 75. This implies that the quality of the reflective coatings will limit the true finesse of the etalon.

In order to achieve a relative repeatability of 0.01 nm wavelength from unit to unit, the thickness of the solid etalon needs to be toleranced to −0.00%/+0.02%. The solid etalon 4 may then be angle tuned up to its acceptance angle (~10 degrees) so that the transmission peaks match a predetermined set of discrete wavelengths. The solid etalon is temperature controlled to maintain its stability. This temperature control may be referenced to an external wavelength standard which is periodically sampled to maintain the wavelength repeatability of the solid etalon 4.

In FIG. 2A, the liquid crystal etalon 5 serves as the course tuning element, discriminating between the peaks defined by the solid etalon 4. A 15 micron thick liquid crystal etalon 5 will have a free spectral range of 52 nm @ a wavelength of 1550 nm. In order to discriminate between the adjacent peaks of the solid etalon 4, the liquid crystal etalon 5 needs to have FWHM bandwidth that is less than the free spectral range (c/2nL) of the solid etalon. This implies a finesse of 30 which should be attainable by reducing the spot size of the incident beam. It is noted that the finesse that may be achieved for a 500 micron beam diameter is typically ~100 and the tuning speed of the etalon is typically 1 kHz over its entire range of 100 nm (10V p-p input). Ferroelectric crystals can achieve higher tuning speeds but have a reduced finesse due to domain defects.

The minimum effective reflectivity of the external cavity must be greater than the reflectivity of the laser diode's front facet multiplied by the square of the linewidth enhancement factor, α. Assuming $R_{f2}$=0.001 and α=10, the effective reflectivity that is required from the external cavity to support stable single mode oscillation is approximately 10% neglecting lens coupling losses. In the case of continuously tunable external cavity laser diodes, approximately 20% feedback (neglecting recoupling efficiency back into the diode's waveguide) is required from the external cavity in order to insure single mode operation. Assuming a 95% reflectivity from the end mirror and a 70% single pass transmission through the liquid crystal etalon 5, a 90% single pass transmission through the solid etalon 4, and a 90% transmission through the 50 nm bandwidth interference filter 3, the external cavity feedback is approximately 30% which insures single mode operation.

The entire cavity is temperature controlled in order to have a repeatable system. The limiting component in this system will be the solid etalon since it is not voltage controlled. It is estimated that a 250 micron fused silica etalon will tune approximately −0.01 nm/degree Kelvin. The present invention has a temperature control servo which maintains a temperature stability of 0.1 K over the bulk cavity and 10 mK for the diode laser. The dependence of the liquid crystal etalon 5 on temperature is about 0.03 nm for this level of temperature control. Thus, the liquid crystal will be able to repeatably select the same peak of the solid etalon.

The preferred embodiment of the invention is shown in FIG. 2A. The active gain medium within the cavity is a laser diode 1. The laser diode 1 has a waveguide in its active region so that only a single transverse mode is amplified. The rear facet or mirror 21 of the laser diode 1, located to the left of the laser diode 1, forms one of the end mirrors of the external cavity. The reflectivity of this mirror 21 is typically greater than 90%, however if the mirror 21 is used as an output coupler, this reflectivity may be as low as 35%. The laser diode's front mirror or facet 22 is an intracavity surface and is antireflection coated so that it has a minimal interference effect with the external cavity E. Typically, a facet reflectivity of 0.01% is required for the laser to be single mode. The beam exiting the laser's front facet 22 passes through a collimating lens 2B so that it focuses on a mirror 11 with a partially reflective coating. Mirror 11 forms the other end mirror of the external cavity E. The laser beam B exiting to the right through the laser diode's antireflection coated front facet 21, is collimated with a lens 2A. This second retroreflector is known as a cat's eye reflector. The beam waist is focused onto the mirror 11 to form a cats-eye reflector which gives a greater alignment tolerance in retroreflection. This alignment intolerance insures the most efficient mode coupling between the external cavity and the laser diode's waveguide. A static Fabry-Perot etalon 4 is used to define a comb of transmission wavelengths to which the external cavity laser may be tuned. Applications, such as wavelength division multiplexing (WDM) require a comb of wavelengths that are precisely defined. The solid etalon 4 in the external cavity defines this set of wavelengths and a liquid crystal etalon 5 in the external cavity selects the solid etalon's transmission order. The solid etalon 4 can, in turn, be referenced to an atomic or molecular wavelength standard so that the comb of wavelengths may be reproducible to 0.01 nm accuracy from laser to laser. To support a stable single mode, the phase of the external cavity is adjusted to match the phase of the solid 4 and liquid crystal 5 etalons. This may be accomplished by means of electro-optically using a liquid crystal phase modulator 12 to adjust the optical phase. An external cavity phase is servo controlled 10 by monitoring the output power of the laser with a photodiode 9. The servo control is known in the art. When the longitudinal mode of the external cavity matches that of the solid etalon, the power will be at a maximum.

A liquid crystal Fabry-Perot interferometer 5 is contained within the external cavity near the mirror 11. The transmission of the liquid crystal Fabry-Perot interferometer 5 selects which of the static etalon transmissions are retroreflected back to the laser diode 1.

The external cavity E is defined by the optical path length from the laser diode's rear facet through the intracavity elements to the other end mirror 11 of the external cavity. To support a stable single mode, the optical path length of the external cavity E is adjusted so that it equals a multiple half-wavelength ($\lambda/2$) of the transmission wavelengths selected by the static etalon 4. This may be accomplished by using a liquid crystal phase modulator 12 to adjust the optical path length or mechanically changing the cavity length with a piezo-electric transducer. The phase adjustment range only needs to cover one free spectral range of the external cavity. It is operated by servo electronics 10, known in the art, that maximize the power output of the laser.

The design choice for the etalons 4,5 that control the frequency of the laser are determined by the required tuning range, the tuning resolution, the required contrast ratio of the main to satellite peaks of the etalon pair, and the finesse of the static etalon and the liquid crystal Fabry-Perot interferometer. There may be many variations in this design depending on what finesse and transmission is possible with liquid crystal Fabry-Perot interferometers. The technique of placing multiple interferometers in series as a spectroscopic filter is known in the art. However, the technique of placing multiple interferometers in an external cavity has not been previously demonstrated.

The transmission of a pair of interferometers is equal to the product of their individual transmissions. The general equations governing the transmission of the interferometers are described previously. The equations apply both to the liquid crystal Fabry-Perot interferometer 5 and the static etalon 4. Since the interferometers are double passed in the external cavity the net transmission is squared to give the transfer function of the interferometer pair. The free spectral range in terms of the separation of the mirror surfaces L, the index of refraction n of the medium sandwiched between the mirrors and the speed of light c is given by:

$$\Delta n = c/2nL$$

were c=3,000,000 m/sec

The resolution of the interferometer is given by the free spectral range divided by its finesse F:

$$\Delta v = \Delta n/F$$

Since the interferometers are double passed in the external cavity the net transmission is squared to give the transfer function of the interferometer pair. The full width half max of the interferometer is given by the free spectral range divided by its finesse F: FWHM=FSR/F. Both the interferometers in this cavity must be tilted off-axis slightly so that we avoid coupling direct reflections off the mirror surfaces.

Referring to FIG. 2B, partially reflective mirror or beamsplitter 8 reflects a portion of the beam to photodiode 9. Servo electronics 10 adjust the voltage in phase compensator 12 according to the signal received from photodiode 9. The external cavity E comprises lens 2B, interference filter 3, modulator 12, etalon 4, liquid crystal etalon 5, and corner cube reflector 6. These components are described in detail in FIGS. 2D and 2F. In this embodiment, the power of the output beam is adjusted in response to the signal received from photodiode 9 which detects the output beam from partially reflective mirror 8.

Referring to FIG. 2C the external cavity E extends from the front facet 22 to flat mirror 11 which is connected to the piezo-electric transducer 7. The piezo-electric transducer 7 is a hollow tube which allows light to be coupled out along an axis. The phase adjustment's range only needs to cover one free spectral range (5 GHz) of the external cavity E. It is operated by servo electronics 10 that maximize the output power of the laser 1. Servo electronis 10 control piezo-electric transducer 7 in response to signal received from photodiode 9. There are some advantages of using the flat mirror 11. By making the flat mirror 11 with a 95% reflectivity, a second low power output beam can be utilized for wavelength reference sources such as an external etalon or vapor cell, known in the art. The flat mirror 11 is also more easily adaptable to a TO-header where the back facet of the laser diode 13 is not available for an output beam as shown in FIGS. 2E and 2F. The reflectance of the flat mirror 11 in this configuration is approximately 70%–80%.

Figure 2D:
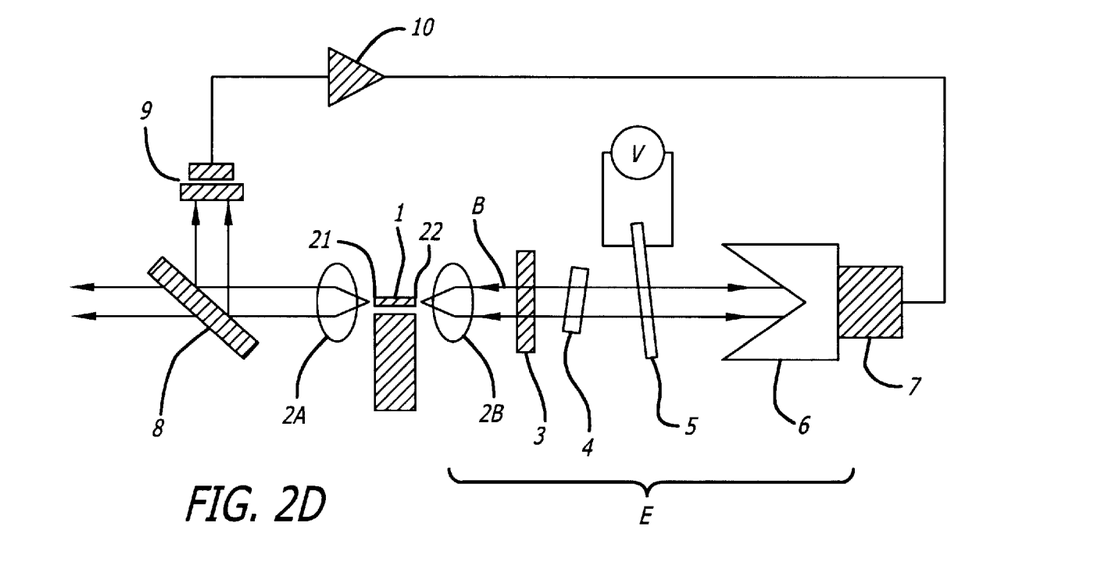
FIG. 2D is a schematic side view of an alternate embodiment of the present invention with a corner cube retroreflector and a piezo-electric transducer.
Figure 2E:
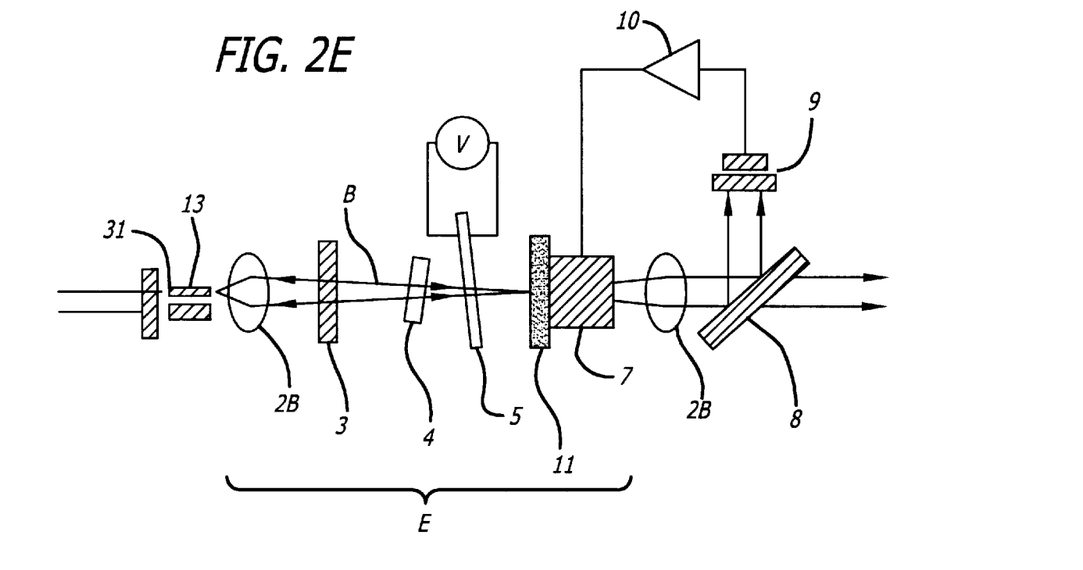
FIG. 2E is a schematic side view of an alternate embodiment of the present invention with a piezo-electric transducer and employing only the output from the front facet of the laser diode.
Figure 2F:
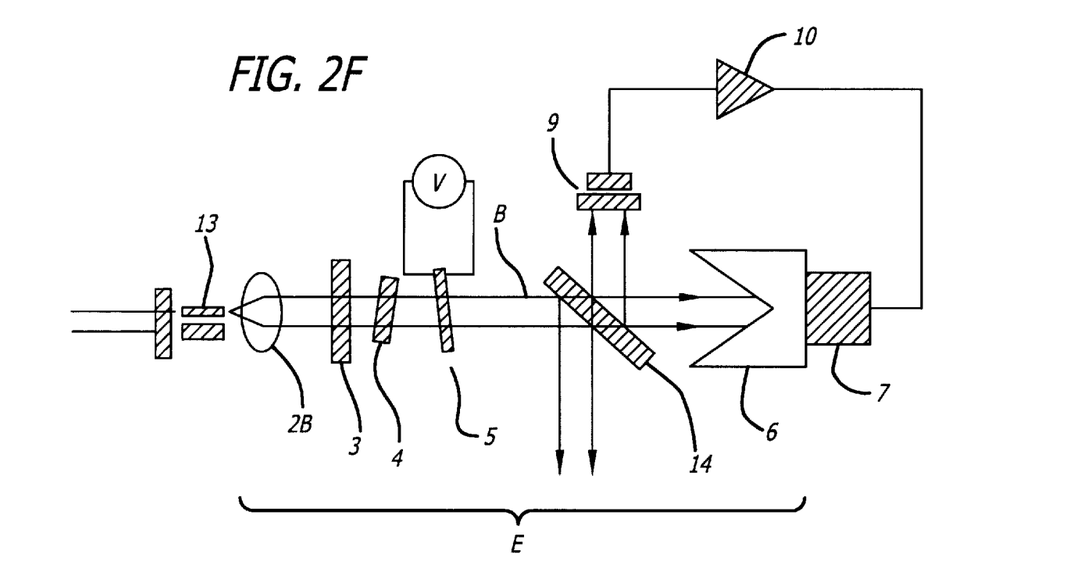
FIG. 2F is a schematic side view of an alternate embodiment of the present invention with a intracavity beamsplitter.

Referring to FIG. 2D the invention is shown with the use of a corner cube reflector 6 in lieu of the flat mirror 11. The external cavity E is defined by the optical path length from the laser diode's rear facet 21 through the intracavity elements to other the end mirror of the cavity formed by corner cube reflector 6. To support a stable single mode, the phase of the external cavity is adjusted to match the phase of the Fabray Perot etalon 4 and liquid crystal etalon 5. This may be accomplished by means of a piezo-electric transducer 7 to translate the corner cube reflector 6 along the optical axis. Corner cube reflector 6 is operated by servo electronics 10 coupled to photodiode 9 whereby the output power of the laser 1 is maximized. This arrangement for detection of the output beam is the same as described in FIG. 2B. In this embodiment, the power of the laser is adjusted in response to the output beam as measured by detection of the beam reflected from beamsplitter 8 to the photodiode 9.

As shown in FIG. 2E the external cavity E consists of an interference filter 3 with a transmission bandwidth equal to the desired tuning range. Interference filter 3 is used if the gain bandwidth of the laser diode 13 is greater than the longitudinal mode spacing (free spectral range ) of the liquid crystal etalon 5 as described in Patel. The transmission of an intracavity solid fused silica Fabry-Perot etalon 4 is used to select a comb of wavelengths. A liquid crystal Fabry-Perot etalon 5 is used to tune the laser diode 13 to one of the solid etalon's 4 transmission peaks. Laser diode 13 is in a TO header. The rear facet of the laser diode 31 is not available as an output coupler. The laser beam may then be coupled out of the external cavity E by a partially reflective coating on the flat mirror 8 as shown or by inserting an intracavity beamsplitter 14 into the laser cavity as shown in FIG. 2F. The flat mirror 8 is also more easily adaptable to a TO-header where the back facet of the laser diode 13 is not available for an output beam. The reflectance of the flat mirror 8 in this configuration is approximately 70%–80%.

Referring to FIG. 2F, a corner cube end mirror 6 is shown with an intracavity beamsplitter 14. This embodiment has a lower output power due to the two output beams which result from the beamsplitter 14. In FIG. 2F each beam would couple out about 10%–15% of the intracavity laser power. The smaller beam waist near the focus of the flat mirror 14 will also increase the effective limiting finesse of the solid etalon 4 by reducing the wavefront error as discussed above. Piezo-electric transducer 7 controls the position of corner cube reflector 6 as described in FIG. 2D.

FIG. 3 clarifies the relationship between various axial modes that may exist and the filtering properties of the interferometers placed within the external cavity. Gain curve A of FIG. 3 shows part of the gain bandwidth of the antireflection coated laser diode. The modulation of this gain curve is due to the presence of residual reflectivity on the front facet. Below this curve, the transmission of the liquid crystal Fabry-Perot interferometer is shown. In this curve B, a finesse of 200 and a free spectral range of 100 nm is assumed, which are close to the actual values. If the bandwidth of the laser diode is so broad that light is transmitted through more than one free spectral range of the liquid crystal interferometer an optional bandpass filter is used to narrow the bandwidth of the laser. The tuning range of the liquid crystal Fabry-Perot interferometer will be less than the free spectral range of the interferometer. This is true so that there will not be two transmission peaks under the gain curve of the laser diode. The double pass transmission of the static etalon is illustrated below this by the comb peaks. These peaks in curve C are separated by 100 GHz which corresponds to the channel spacings for the WDM communications wavelengths and has a finesse of 100. Thus, the static etalon will have a bandpass of 1 GHz which will filter out the external cavity longitudinal modes. The combined transmission of the liquid crystal Fabry-Perot interferometer and the static etalon is shown as curve D of FIG. 3 on an expanded scale. On this we also show the external cavity modes.

Although the present invention has been described with reference to preferred embodiments, numerous modifications and variations can be made and still the result will come within the scope of the invention. No limitation with respect to the specific embodiments disclosed herein is intended or should be inferred.

We claim:

1. A tunable laser source comprising:
   a laser having a optical cavity containing a gain medium, said optical cavity having a anti-reflective coating on a facet whereby a beam is emitted; and
   an external cavity optically connected to said optical cavity, said external cavity having a solid etalon, an interference filter and an adjustable etalon.

2. The tunable laser source as in claim 1, wherein said external cavity further comprises
   a lens and said adjustable etalon is a liquid crystal device.

3. The tunable laser source as in claim 2, wherein said external cavity further comprises:
   a liquid crystal phase modulator disposed between said solid etalon and said liquid crystal etalon, a refractive index of said liquid crystal phase modulator being adjustable in response to the beam within said external cavity.

4. The tunable laser source as in claim 1, wherein said external cavity further comprises a partially reflective retroreflector.

5. The tunable laser source as in claim 4, wherein said liquid crystal phase modulator further comprises:
   a photodiode having a signal;
   a control means whereby said signal is received from said photodiode, said signal being transitted to said liquid crystal phase modulator to adjust a refractive index, whereby a wavelength of the external cavity is determined;
   said wavelength determining the output wavelength of said optical cavity.

6. The tunable laser source as in claim 5, wherein said external cavity further comprises:
   a partially reflecting output face having a cats eye reflector;
   an amplifier waveguide inside the external cavity having a collimating lens whereby said beam is focused on the partially reflective retroreflector.

7. The tunable laser source as in claim 1, wherein said external cavity further comprises a partially reflective retroreflector located at a focal point of said lense.

8. The tunable laser source as in claim 7 further comprising a piezo-electric transducer connected to said partially reflective retroreflector.

9. The tunable laser source as in claim 8 further comprising:
- control means;
- a photodiode having a signal connected to said control means;
- said control means receiving said signal, and whereby a signal is transitted from said control means to said piezo-electric transducer, whereby a position of said partially reflective retroreflector is determined;
- said position of said partially reflective retroreflector determining an output wavelength of said external cavity.

10. The tunable laser source as in claim 1, further comprising a corner reflector.

11. The tunable laser source as in claim 10, wherein said liquid crystal phase modulator further comprises:
- a control means;
- a photodiode having a signal;
- a partially reflective mirror whereby a partially reflected beam is received by said photodiode; and
- said photodiode transmits said signal to said control means which transmits a siganl to said liquid crystal phase modulator whereby an output wavelength for said external cavity is determined.

12. The tunable laser source as in claim 10, wherein said corner reflector further comprises:
- a piezo-electric transducer;
- a control means;
- a photodiode having a signal;
- a partially reflective mirror whereby a partially reflected beam is received by said photodiode; and
- said photodiode transmitting said signal to said control means whereby said piezo-electric transducer determines a position of said corner reflector;
- said position of said corner reflector determining an output wavelength of said laser.

13. The tunable laser source as in claim 12, wherein said laser is connected to a TO-header.

14. The tunable laser source as in claim 1, further comprising a partially reflective retroreflector.

15. The tunable laser source as in claim 14, further comprising:
- control means;
- a photodiode connected to said control means;
- a partially reflective mirror whereby a partially reflected laser beam is received by said photodiode; and
- said control means for receiving a signal from said photodiode, and whereby a signal is transitted from said control means to said piezo-electric transducer whereby a position of said partially reflective retroreflector is determined;
- said position of said partially reflective retroreflector determining an output wavelength of said laser.

16. The tunable laser source as in claim 15, wherein said laser is connected to a TO-header.

17. The tunable laser source as in claim 2, wherein said liquid crystal etalon comprises a liquid crystal Fabry-Perot interferometer.

18. The tunable laser source as in claim 17, wherein said solid etalon comprises a Fabry-Perot etalon.

19. The tunable laser source as in claim 2, wherein said liquid crystal etalon comprises a ferroelectric Fabry-Perot interferometer.

20. The tunable laser source as in claim 1, wherein said solid etalon has a free spectral range that matches a wavelength division multiplexing wavelength.

21. A method for tuning a laser source, comprising:
- emitting a light beam from a laser source that is directed through a solid etalon, an interference filter and an adjustable etalon;
- detecting the light beam; and
- varying a refractive innex of the adjustable etalon.

22. The method as in claim 21, further comprising varying a refractive index of a modulator located in an optical path of the light beam.

\* \* \* \* \*